(12) United States Patent
Baleras et al.

(10) Patent No.: US 8,039,306 B2
(45) Date of Patent: Oct. 18, 2011

(54) 3D INTEGRATION OF VERTICAL COMPONENTS IN RECONSTITUTED SUBSTRATES

(75) Inventors: François Baleras, Saint George de Commiers (FR); Jean-Charles Souriau, Saint Egreve (FR); Gilles Poupon, Seyssinet (FR); Sophie Verrun, Grenoble (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 12/663,349

(22) PCT Filed: Jun. 5, 2008

(86) PCT No.: PCT/EP2008/057005
§ 371 (c)(1),
(2), (4) Date: Mar. 24, 2010

(87) PCT Pub. No.: WO2008/148847
PCT Pub. Date: Dec. 11, 2008

(65) Prior Publication Data
US 2010/0181679 A1    Jul. 22, 2010

(30) Foreign Application Priority Data
Jun. 7, 2007  (FR) .................................... 07 55578

(51) Int. Cl.
*H01L 21/00* (2006.01)
*H01L 21/4763* (2006.01)
*H01L 23/02* (2006.01)
*H01L 23/34* (2006.01)
*H01L 23/04* (2006.01)
*H01L 23/48* (2006.01)
*H01L 23/28* (2006.01)

(52) U.S. Cl. ........ 438/107; 438/127; 438/618; 257/686; 257/724; 257/730; 257/773; 257/787

(58) Field of Classification Search ...................... None
See application file for complete search history.

(56) References Cited

U.S. PATENT DOCUMENTS

| 4,706,166 A | * | 11/1987 | Go ................................ 361/771 |
| 5,104,820 A | | 4/1992 | Go et al. |
| 5,353,498 A | | 10/1994 | Fillion et al. |

(Continued)

FOREIGN PATENT DOCUMENTS

DE    199 20 444 A1    11/1999

(Continued)

OTHER PUBLICATIONS

Ciaran Cahill, et al., "Thermal Characterization of Vertical Multichip Modules MCM-V", IEEE Transactions on Components, Packaging and Manufacturing Technology, Part A, vol. 18, No. 4, XP000542882, Dec. 1, 1995, pp. 765-771.

*Primary Examiner* — Scott B Geyer
(74) *Attorney, Agent, or Firm* — Oblon, Spivak, McClelland, Maier & Neustadt, L.L.P.

(57) ABSTRACT

A reconstituted electronic device including: a first face and a second face; a plurality of individual chips placed perpendicular to the faces, each individual chip carrying, on one of its surfaces, at least one component, tracks, and a connection mechanism that are flush with one or other of the faces of the reconstituted electronic device; and an encapsulant that encapsulates the individual chips.

26 Claims, 16 Drawing Sheets

U.S. PATENT DOCUMENTS

| | | | | |
|---|---|---|---|---|
| 5,362,986 A | * | 11/1994 | Angiulli et al. | 257/723 |
| 5,604,377 A | * | 2/1997 | Palagonia | 257/685 |
| 5,616,962 A | * | 4/1997 | Ishikawa et al. | 257/777 |
| 5,673,478 A | | 10/1997 | Beene et al. | |
| 5,688,721 A | | 11/1997 | Johnson | |
| 5,719,438 A | * | 2/1998 | Beilstein et al. | 257/686 |
| 5,726,492 A | * | 3/1998 | Suzuki et al. | 257/685 |
| 5,793,116 A | * | 8/1998 | Rinne et al. | 257/777 |
| 5,904,502 A | | 5/1999 | Ference | |
| 5,910,682 A | * | 6/1999 | Song | 257/685 |
| 5,943,213 A | * | 8/1999 | Sasov | 361/705 |
| 5,956,236 A | * | 9/1999 | Corisis et al. | 361/783 |
| 5,963,793 A | | 10/1999 | Rinne et al. | |
| 5,990,566 A | * | 11/1999 | Farnworth et al. | 257/783 |
| 6,151,220 A | * | 11/2000 | Sakamoto et al. | 361/773 |
| 6,198,164 B1 | * | 3/2001 | Choi | 257/723 |
| 6,380,616 B1 | * | 4/2002 | Tutsch et al. | 257/686 |
| 6,734,538 B1 | * | 5/2004 | Sturcken | 257/686 |
| 7,050,303 B2 | * | 5/2006 | Park et al. | 361/715 |
| 7,429,782 B2 | * | 9/2008 | Brunnbauer et al. | 257/678 |
| 2002/0042163 A1 | | 4/2002 | Kim | |
| 2005/0023656 A1 | | 2/2005 | Leedy | |
| 2007/0023883 A1 | | 2/2007 | Brunnbauer et al. | |

FOREIGN PATENT DOCUMENTS

| | | |
|---|---|---|
| DE | 10 2005 030 465 A1 | 1/2007 |
| EP | 0 695 494 B1 | 2/2001 |
| GB | 2 300 047 A | 10/1996 |
| WO | WO 94/26083 | 11/1994 |

* cited by examiner

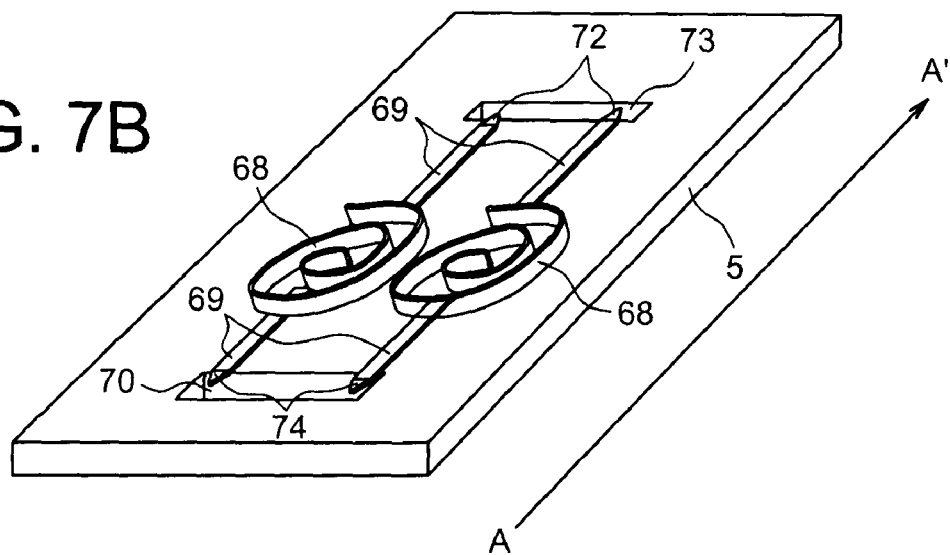
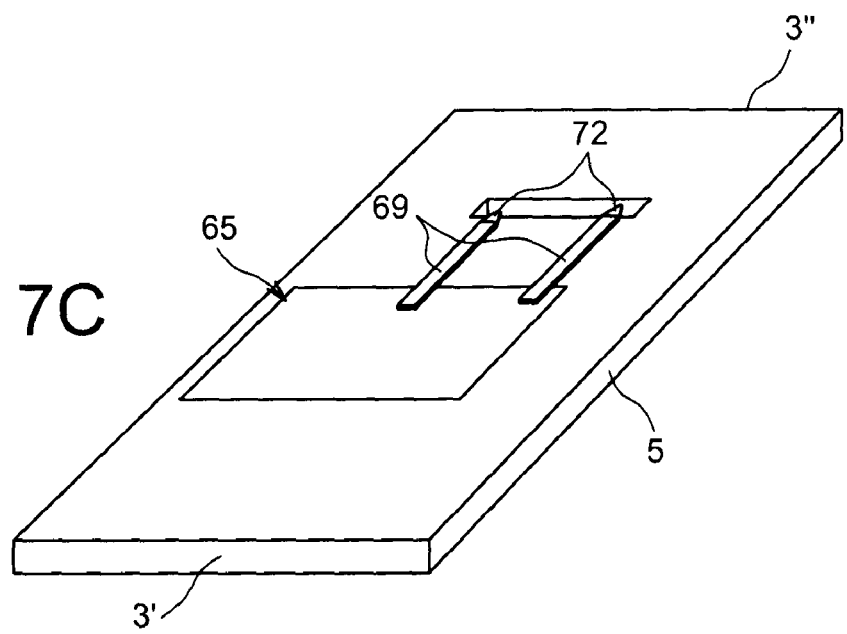

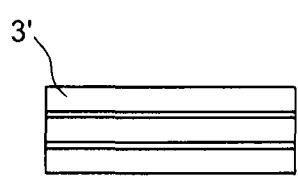 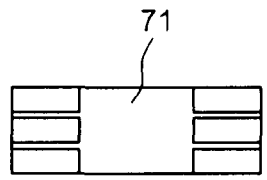 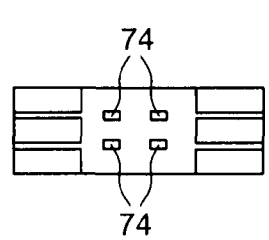
FIG. 8A    FIG. 8B    FIG. 8C
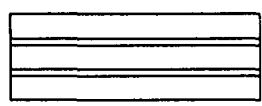 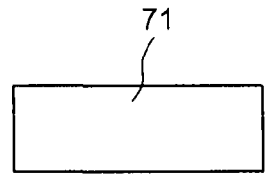 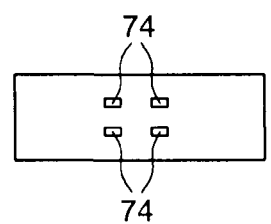
FIG. 9A    FIG. 9B    FIG. 9C
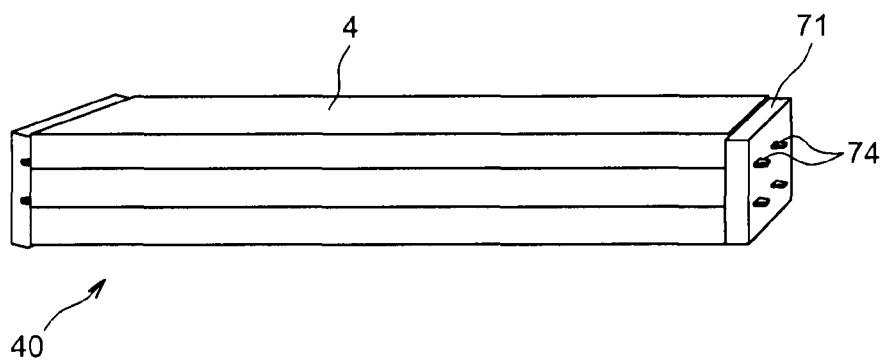
FIG. 10

3D INTEGRATION OF VERTICAL COMPONENTS IN RECONSTITUTED SUBSTRATES

TECHNICAL FIELD AND PRIOR ART

The invention relates to the field of integrating electronic components in a substrate.

It makes it possible to form reconstituted substrates that contain components, the connections of which open onto one surface of the substrate, the components being placed perpendicular to this surface. Such reconstituted substrates have a high component density. They may themselves be stacked if necessary, which further contributes to a substantial increase in component density.

The increase in the integration density of components and the quest to improve the performance and reduce the costs of devices lead suppliers of systems to develop more and more compact devices.

Novel integration techniques are being developed that make it possible to increase the compactness of chips, or systems of chips, while at the same time reducing their cost and maintaining their reliability.

Document EP 0695494 describes a module comprising a series of integrated circuits, for example memory chips. These memory chips are assembled on an active chip comprising the interconnections for the different chips. The active chip comprises fusible alloy bosses to assemble and connect the memory chips. All of the connections of the chips are transferred to the most active edge to be able to connect them onto the sides of the casing. The result is a complicated assembly and one in which component density is not optimised.

Document U.S. Pat. No. 5,688,721 describes the rerouting of chips to transfer the connections of these chips onto the edges of a block of assembled chips. More specifically, tracks are connected to pads by metallised vias, through a first insulating layer. The tracks are covered with a second insulating layer, then an adhesive layer is added to stack the substrates. A structure described in this document has cuts and re-growths of contacts on one lateral face, perpendicular to a stacking of chips. The contacts on the lateral face are obtained by metallisation of a lateral insulating layer. The different stacked stages are connected by metallisations on said lateral face.

This technique has several drawbacks.

Firstly, a first problem relates to the surface of the silicon, which ends up bare (after cutting) on the surface to be treated; a passivation layer therefore must be deposited on this surface.

A second difficulty relates to the cutting of materials of different hardnesses (there are in particular, in the stacking, pliable materials such as polyimide). Furthermore, the fact of cutting the metal causes burrs and a contamination of the silicon.

Another problem is that of the assembly of components of different dimensions, which this technique does not enable to be done.

In document DE 10 2005 30465, semi-conductor devices are assembled. Each of these devices respectively comprises a chip encapsulated in a plastic material. These different devices are then stacked then encapsulated by a material. In this document, the connections are thus placed on the encapsulation layer of the chip.

In the same way, in the article of Cahill et al., entitled "THERMAL CHARACTERIZATION OF VERTICAL MULTICHIP MODULES MCM-V", IEEE Transactions on Components, Packaging and Manufacturing Technology: Part A, IEEE Service Center, vol. 18, no. 4, 1 Dec. 1995, pages 765-771, bare chips (in other words not encapsulated) are not integrated directly in a device. Indeed, each chip is firstly placed on a substrate to which it is connected by external connections (wire bonding), then the assembly thereby obtained is transferred onto a support.

The problem is thus posed of finding novel methods of producing in a simpler manner reconstituted substrates and stackings, or 3D integrations, of chips, particularly bare, non encapsulated chips.

DESCRIPTION OF THE INVENTION

The invention firstly relates to a method of producing a reconstituted electronic device comprising, between a first face and a second face, a plurality of individual support substrates placed perpendicular to said faces, each individual support substrate comprising, for example on one of its surfaces, at least one component, tracks and connection means, said method comprising:

a) the positioning of each individual support substrate, perpendicular to a reference surface, b) the encapsulation of the individual support substrates with an encapsulant, so that the connection means of each individual support substrate are flush with one or other of the faces of the reconstituted substrate, or the two faces of the reconstituted substrate.

Preferably, each individual support substrate comprises a first side and a second side opposite to the first. The tracks and connection means are directed, in the plane of the individual support substrate, from the component or components, to the first or the second side, or to the two sides.

It is then one of the first and second sides that are positioned on the reference surface, while at the same time respecting a positioning of each individual support substrate perpendicular to said reference surface.

A thinning of the reconstituted device may be carried out so that the connection means of each individual support substrate are flush with one or other of the faces of the reconstituted substrate.

According to the invention, a reconstituted substrate structure is formed comprising components (in the wider sense of the term, thus which can comprise active elements and/or passive elements) which, for example, have been formed "flat", or horizontally on a substrate, and which may be integrated in a vertical manner to form a reconstituted final substrate. The surfaces of this reconstituted final substrate contain connection means to the components.

The invention also relates to a reconstituted electronic device comprising:

a first face and a second face, a plurality of individual support substrates placed perpendicular to said faces, each individual support comprising, for example on one of its surfaces, at least one component, tracks and connection means that are flush with one or other of the faces of the reconstituted substrate, and an encapsulant for encapsulating the individual support substrates.

In a method and a device according to the invention, at least one component may be a metal track (the individual support substrate then comprising, for example on one of its faces, a metal track forming component and connection track), which makes it possible to interconnect the two faces of the reconstituted substrate and/or to interconnect a component and one of the faces of the reconstituted substrate. More complex components (MEMS electronic circuits for example) may also be integrated on or in an individual support substrate, and thus be integrated into the final reconstituted substrate.

At least two individual support substrates may be placed perpendicular to said surface, by forming between them a non zero angle. This may be advantageous for the formation of directional sensors.

According to another aspect of the invention, at least two individual support substrates may be stacked, the two substrates then being positioned together, perpendicular to said reference surface.

At least one individual support substrate may be provided, on one of its sides, with an encapsulant.

At least one electronic component may be positioned on at least one of the two faces of the reconstituted electronic device. But, preferably, even the components placed on the surface of the reconstituted substrate are incorporated in the substrate and only electrical connections remain on the surface.

A method according to the invention preferably comprises the positioning of a frame delimiting zones in each of which one or more individual support substrates may be positioned.

The reference surface on which each individual support substrate is placed perpendicularly may be the surface of a substrate, or instead an adhesive surface.

Connection tracks may be formed on the first and/or the second face of the reconstituted electronic device. It is then possible to form an interconnection after the reconstitution of a substrate, in order to achieve collectively the connection of a series of systems.

BRIEF DESCRIPTION OF DRAWINGS

FIGS. 7A-7C represent various components with their connection elements for the purpose of integration in a reconstituted substrate according to the invention.

FIGS. 8A-9C are steps of preparing an assembly of components intended to be incorporated vertically into a reconstituted substrate according to the invention.

FIG. 10 represents a stacking of components forming an assembly intended to be incorporated vertically into a reconstituted substrate according to the invention.

DETAILED DESCRIPTION OF SPECIFIC EMBODIMENTS

Figure 1A:
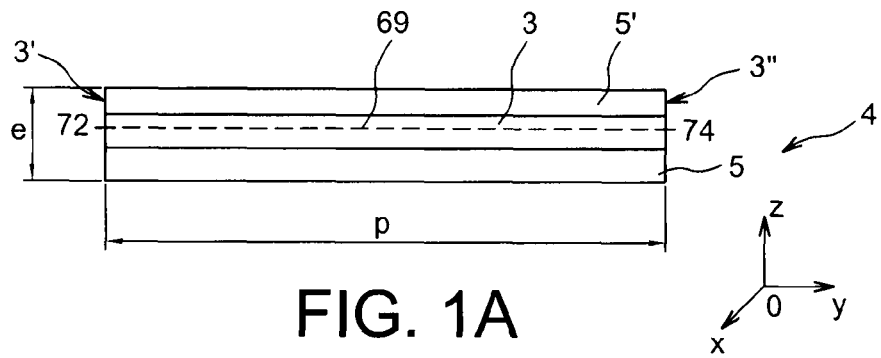
FIGS. 1A to 1C are examples of components that may be used for the purpose of producing a reconstituted substrate according to the invention.
Figure 1B:
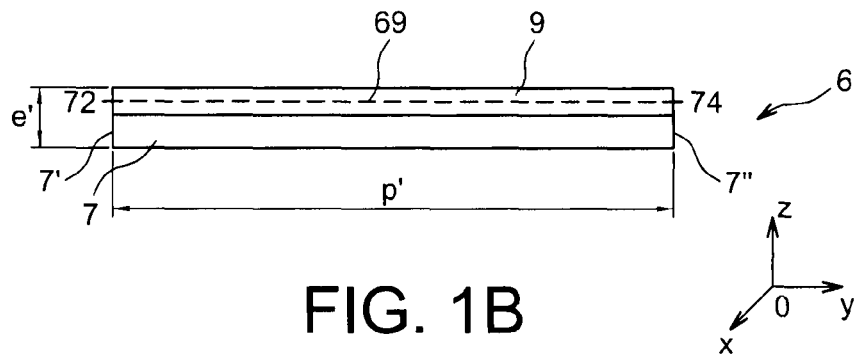
Figure 1C:
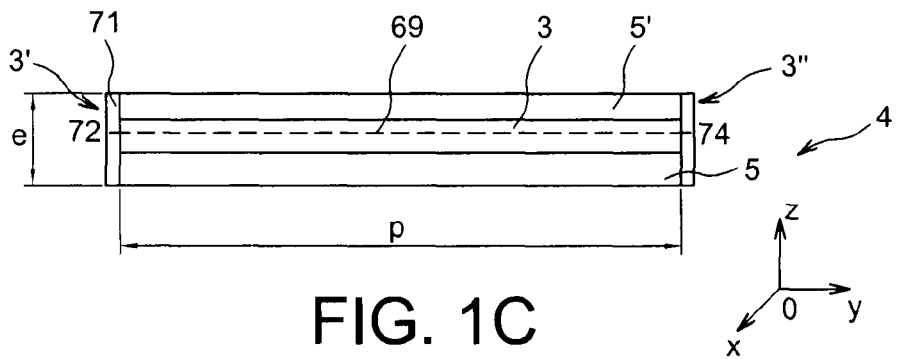

FIGS. 1A to 1C represent two chips or dies 4, 6, each comprising one or more electronic components 3, 9 and an individual support substrate 5, 7, and that can be used in a reconstituted substrate according to the invention. The references 3', 3", 7', 7" designate a first side and a second side, or a first lateral portion and a second lateral portion, of these chips.

To simplify things, "component" will sometimes be used hereafter for each of these chips 4, 6.

In the case of the chip 4 of FIG. 1A, part 3, forming the component or the plurality of components, is encapsulated between a substrate 5, on which it is formed and a substrate or a lid 5'.

In the case of the assembly 6 of FIG. 1B, part 9, forming the component or the plurality of components, simply rests on a substrate 7.

Each of the chips 4, 6 may have for example a thickness e between for example 300 µm and 2 mm. Each support substrate preferably has a substantially rectangular or square shape, as may be seen in the examples of FIGS. 7A-7C, which is suitable for the formation of a reconstituted substrate. In FIGS. 1A-1C, but also 7A-7C, the sides 3', 3", 7', 7" form the small sides of a rectangle.

Two lateral contacts 72, 74, or contact pads, are also visible in each of these figures: these contacts project beyond the lateral portions, or are flush with these lateral portions, on either side of the component or the chip. The number of contacts is not restricted to two, but may be any number, certain components only necessitating one contact, others a higher number (for example 4 for the components of FIGS. 7A and 7B). The contacts may be placed, depending on requirements, on the two sides 3', 3", 7', 7" of the component or on one single side of this component, as in the case, for example, of the component of FIG. 7C. Reference 69 designates a possible internal prerouting of the component, the contacts 72, 74 of which constitute terminals.

If necessary, as shown in FIG. 1C, the lateral ends of a component are encapsulated or covered with an encapsulant 71 such as a resin. Despite this material, the contact or contacts 72, 74 remain accessible from the exterior of the component. Otherwise, this component of FIG. 1C remains similar to that of FIG. 1A.

The representations of FIGS. 1A to 1C are highly schematic: not just the component 3, 9 itself but also its internal prerouting means 69 and its connection means 72, 74 are formed on the individual support substrate 5, 7, as the examples of structures of FIGS. 7A-7C, 12A, 12B 14A, and 15A show in more detail. This structure imparts to each assembly 4, 6 a compactness that enables numerous individual components to be combined in the form of a reconstituted substrate and avoids having to resort, as in document U.S. Pat. No. 5,688,721, to insulating layers through which metallised vias have to cross.

In the three examples presented above, the depth p, p' of the component (for example around 1 mm to 1 cm), measured perpendicular to the direction OZ of the stacking substrate (5, 7)—component (3, 9)—if necessary substrate 5', is a lot greater than its thickness e, measured in the direction of the stacking. It is thus possible to speak of a plane of the component, defined by the plane of one of the substrates 5, 5', 7 and parallel to the plane XOY.

Examples of chips 4, 6 may be MEMS, or a resistance, or a capacitance or an inductance, or a filter. More detailed examples of components will be given in the remainder of this description.

Figure 1D:
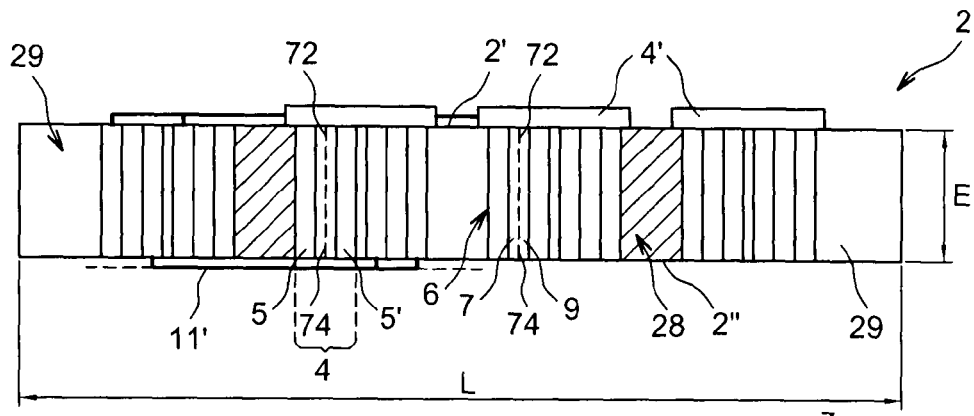
FIGS. 1D and 1E are examples of reconstituted substrates according to the invention.
Figure 1E:
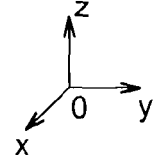
Figure 1E:
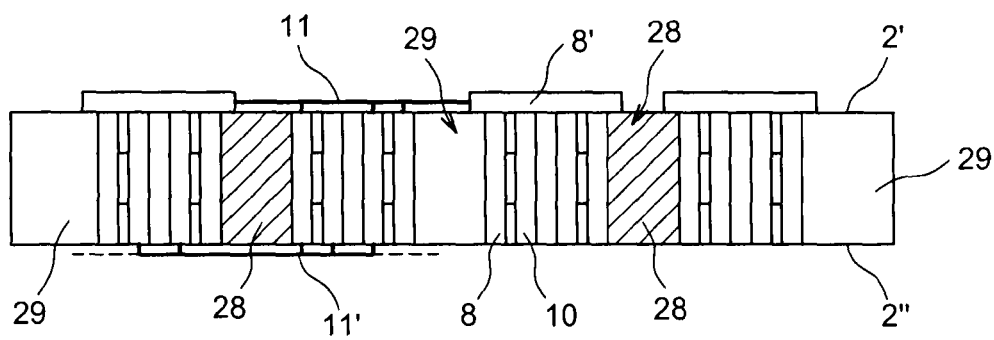

FIGS. 1D and 1E illustrate examples of 3D structure according to the invention reconstituted by means of components such as those described above. In these examples, as well as for the remainder of the description, this structure essentially comprises a substrate 2, known as reconstituted substrate, of thickness E for example between 50 μm and several hundreds of μm, for example 500 μm or even 1 mm. This substrate has a width L, for example between several centimetres, for example 2 cm or 5 cm, and 20 cm or even 30 cm (there may even be panels of larger size), much greater than this thickness, and thus defines a plane xOy also known as "plane of the reconstituted substrate". It may be designated arbitrarily as "horizontal plane", a direction Oz, substantially perpendicular to this plane, being designated as "vertical".

The example of FIG. 1D represents the vertical assembly, perpendicular to the plane xOy, of chips 4, 6 of the type of those described above with reference to FIGS. 1A to 1C; for example component 4 is a microprocessor and component 6 is a passive component. Each of these components is assembled vertically: it is provided with the substrate 5, 5', 7 on which it has been formed or assembled beforehand. Component 4 (of FIG. 1A) with its substrates 5, 5' and component 6 (of FIG. 1B) with its substrate 7 are represented schematically in FIG. 1D. In the same way, in the remainder of the present description, at least one part of the components assembled vertically in a reconstituted substrate 2 are assembled with the substrate on which they have been formed or assembled beforehand, without said substrate being explicitly represented in each of the figures. Only two components 4, 6 are identified and represented in a detailed manner in FIG. 1D, but a reconstituted substrate 2 may comprise a large number of components of this type. The reconstituted substrate may thus comprise a network of components. By way of example, there may be a network of passive components or chips 6 assembled vertically, for example a network of resistances, and/or capacitances and/or inductances, and/or one or more filters, etc.

In the present invention, each individual substrate and its component (electronic and/or mechanical part of the chip) with its tracks and its connection means forms a "bare" chip or die (in other words not encapsulated or without packaging) and it is this chip that is transferred onto the reference surface before encapsulation. The tracks and the connection means are integrated in the chip, only the ends or terminals of these connection means are flush.

For each of these components, the plane of the substrate 5, 7 on, or in, which it is assembled is directed perpendicular to the plane xOy defined by the reconstituted substrate. In other words, the components are assembled in such a way that the direction of the elementary stacking that each constitutes (identified by the direction OZ in FIG. 1A-1C) is oriented not along the direction Oz but in the plane xOy or in a parallel plane. This assembly direction is such that the one or more connection means or contact pads 72, 74 of each component appear in one of the two surfaces 2', 2" of the reconstituted substrate. These two surfaces are defined by the lateral portions 3', 3", 7', 7" of elementary components (see FIGS. 1A, 1B). Arbitrarily, the surface 2' is known as front face of the substrate 2, and the surface 2" is known as rear face.

The example of FIG. 1E represents the vertical assembly of MEMS 8, 10, also introduced into the substrate 2 with their own substrate. Examples of structures of MEMS are given hereafter with reference to FIGS. 12A and 12B. One or more MEMS may be of the type comprising one or more cavities under vacuum or under neutral gas or instead at controlled pressure.

In FIGS. 1D and 1E, the reference 29 designates an assembly frame, which makes it possible to delimit zones in each of which one or more components 4, 6, 8, 10 are placed. Finally, an encapsulant 28 makes it possible to fill spaces between the components, or between the components and the frame. It can also play a role of supporting components and the whole of the reconstituted substrate.

In these two examples, additional components 4', 8' are assembled on one and/or the other of the surfaces 2', 2" of the substrate 2, by standard assembly and connection methods (for example by flip-chip, or wire-bonding, or ACF). Among these surface components, there may be in particular one or more microprocessors and/or several MEMS.

These components assembled on the surface may be in direct contact with connections 72, 74 of vertically assembled components 4, 6 8, 10, or by means of a circuit, or rerouting, 11, 11' formed on the front face 2' or rear face 2". These circuits or reroutings 11, 11' can also, or alternatively, make it possible, to connect between them vertically assembled components 4, 6, or 8, 10. These surface reroutings 11, 11' are represented as simple connection lines in the figures, but each of them may in fact comprise a complex system of tracks and connections, perpendicular to the plane of the figure. To form these surface reroutings, it is possible to employ standard microelectronic methods (for example cathodic sputtering of a continuous base, lithography and copper electrolysis, stripping and etching of the continuous base).

In all the examples of reconstituted substrates given in the remainder of this description, such surface reroutings may be provided but are not explicitly represented in the figures.

Figure 2A:
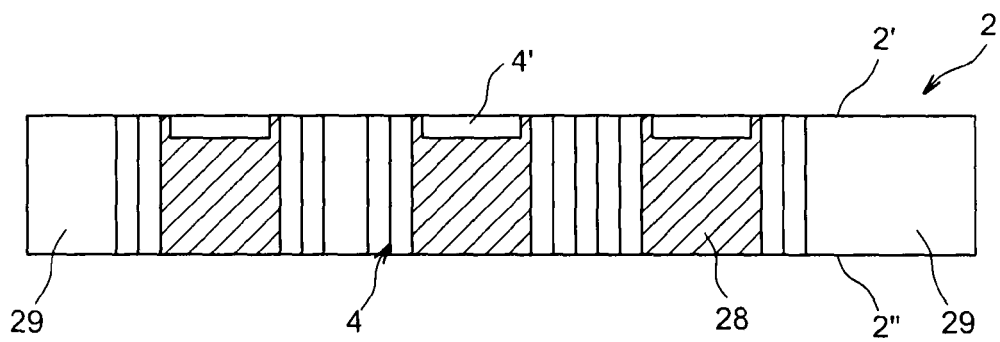
FIGS. 2A-2C are other examples of reconstituted substrates according to the invention.
Figure 2B:
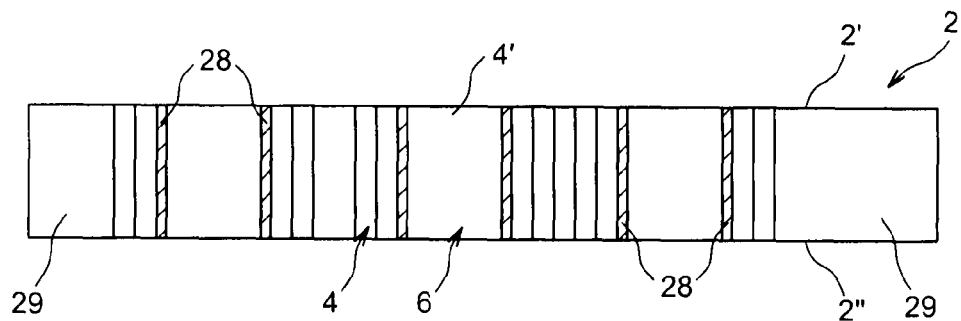

FIGS. 2A and 2B illustrate two other examples of 3D structures according to the invention, for which all of the components, whether vertical components 4, 6, or horizontal components 4', are incorporated in the reconstituted substrate 2. Only one or more rerouting circuits can appear on one and/or the other of the surfaces 2', 2". The reconstituted substrate obtained is then very compact.

Figure 2C:
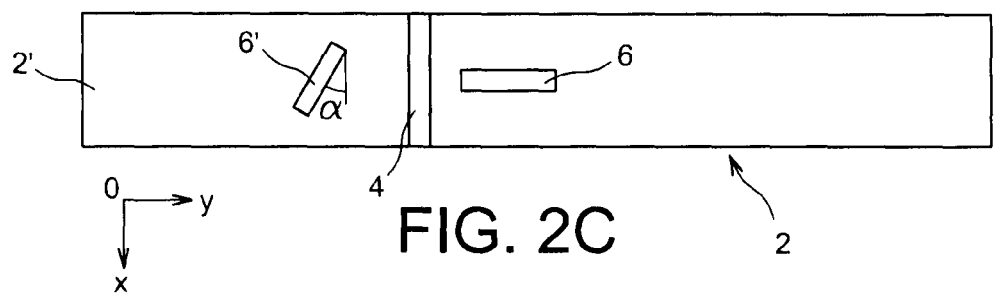

The example of FIG. 2B—which could also comprise horizontal components 4' incorporated in the reconstituted substrate—has vertical components 4, 6, some of which (the components 6) are positioned at 90° compared to the others 4. This placement will be better understood by means of FIG. 2C, which represents a top view of the surface 2' of the reconstituted substrate of FIG. 2B: the two components 4, 6 are assembled perpendicular to the plane xOy of the substrate 2, but with an angle of 90°, between them, in this plane. Another component 6' is represented, with another angle α with the direction Ox of the component 4 in this same plane.

This possibility of placing components forming an angle in the plane of the substrate 2 is particularly advantageous when direction sensitive sensors are used. Thus, several monoaxial type (sensitive along a single direction) and/or biaxial type MEMS may be assembled to form a triaxial sensor. For example, component 4 comprises a biaxial MEMS and component 6 comprises a monoaxial MEMS.

As is shown from the above description, the invention makes it possible to form complex, reconstituted systems from individual bare chips or dies (not encapsulated or without packaging), which may be tested beforehand.

Figure 17A:
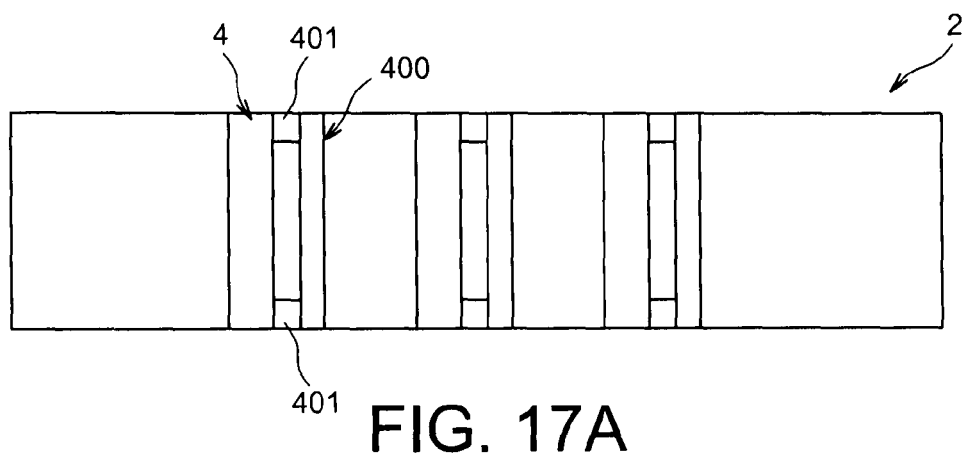
FIGS. 17A and 17B represent the formation of components with physical accesses to the exterior.
Figure 17B:
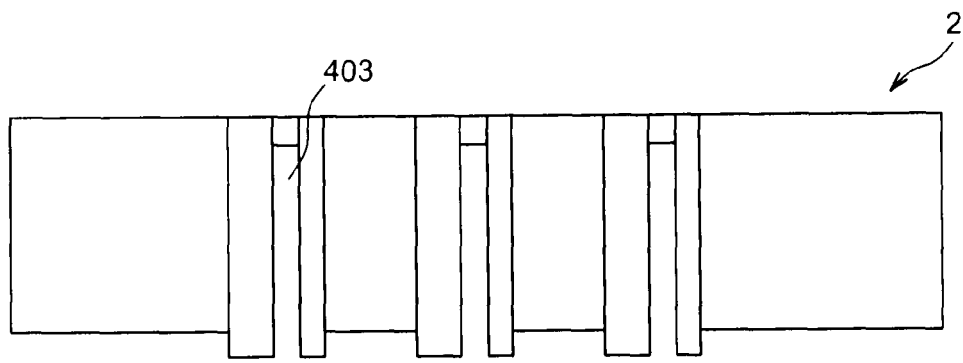

In some cases, certain sensors or fluidic components can require physical access to the exterior: for example one or more openings for one or more fluidic components and/or one or more pressure sensors, etc. The physical accesses to the exterior may be obtained in different ways. For example, as illustrated in FIGS. 17A, 17B, in which are not represented in a discriminating manner the frame and the encapsulant, it is possible to protect the sensor 4 with a lid 400 sealed beforehand by resin sealing 401; during the manufacture of the reconstituted substrate, a polishing or a "grinding" of the rear face is carried out, which may be completed by a plasma etching to open the cavity 403 (FIG. 17B).

A sacrificial layer may also be deposited on a part of the chip. In the same way, the cavity is opened by grinding, then plasma etching, or by carrying out a dissolution of the sacrificial resin. An assembly of the components may also be provided, which avoids a filling of the cavity during the encapsulation operation.

In one embodiment of the invention, the components integrated vertically in a reconstituted substrate 2 are metal tracks. As will be seen hereafter, this will in particular make it possible to reconstitute a substrate of components with a vertical prerouting.

Figure 3A:
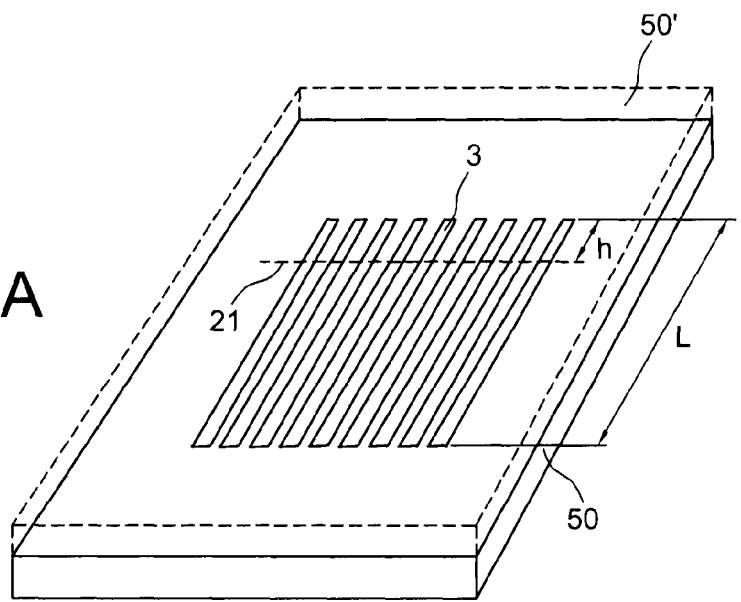
FIG. 3A illustrates the preparation of vias intended to be incorporated into a reconstituted substrate according to the invention.
Figure 3B:
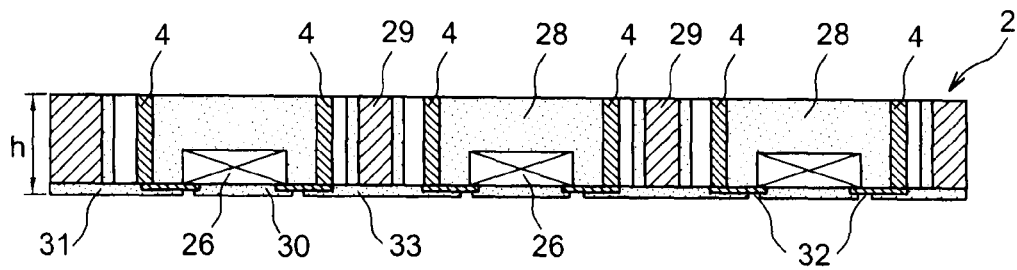
FIG. 3B represents a reconstituted substrate according to the invention, provided with vertical vias.

Thus, as illustrated in FIG. 3A, it is possible to form collectively beforehand, on a substrate 50, metal tracks 3 of length L greater than the final thickness h of the reconstituted substrate 2, which is illustrated in FIG. 3B. The substrate on which the tracks 3 are formed may be cut to the appropriate format to form individual substrates 5: thus, a cutting line 21 is shown in FIG. 3A, making it possible to form a series of tracks having the requisite length h. Reference 50' designates a second substrate, which may be assembled to the substrate 50 after formation of tracks in order to enable a better handling of the assembly or individual components obtained after cutting. The latter then have a structure similar to that represented in side view in FIG. 1A, with the individual substrates 5, 5'.

Method steps to obtain a reconstituted substrate as illustrated in FIG. 3B will be given with reference to FIGS. 4A-4E.

A substrate 27 (FIG. 4A) is selected, the surface 27' of which defines a plane (xOy) that is going to determine the plane of the substrate that is going to be reconstituted.

A frame 29 (FIG. 4B) that is going to make it possible to delimit zones in each of which one or more components 4 will be able to be placed is positioned on this substrate 27.

The vias 4, obtained for example as explained above by cutting of the substrate 50 (FIG. 3A), are positioned perpendicular to the surface 27' of the substrate 27, in the zones delimited by the frame 29 (FIG. 4C): one of their lateral ends 3' or 3" (FIG. 1A) is positioned on this surface, and the direction of the stacking substrate 5—metal track 3—substrate 5' is directed parallel to the plane xOy or to the surface 27'.

Then (FIG. 4D), it is possible to place components 26 for which the vertical tracks 4 will assure a vertical rerouting. This step (positioning of components 26) and the preceding step (positioning of vias 20) may be inversed. But each "bare" chip or die (in the sense already defined above, in other words a non encapsulated chip or without packaging) is transferred onto the reference surface before encapsulation.

An encapsulation 28 of the assembly is then carried out (FIG. 4E) by means for example of a resin. Since the components or vias 4 are incorporated in the frame with their individual substrate, any creep of the resin will not affect them.

Figure 4A:
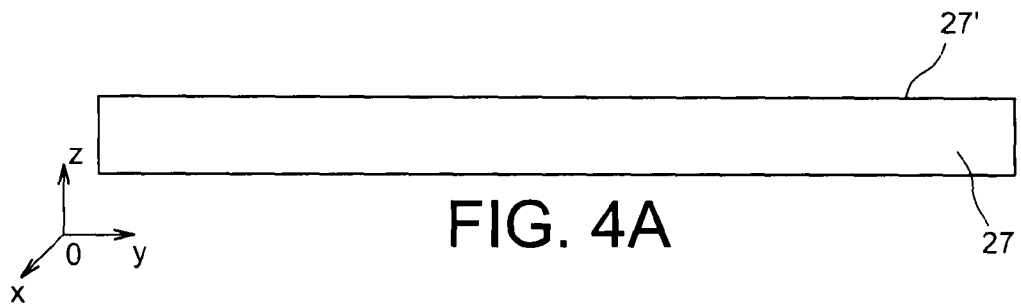
FIGS. 4A-4E are steps of a method according to the invention, for the purpose of producing a substrate with vertical vias.
Figure 4B:
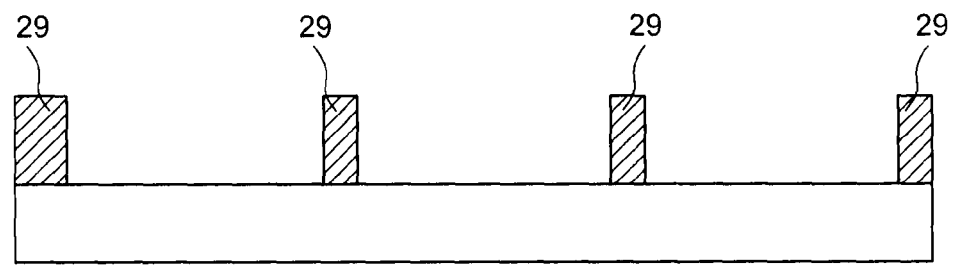
Figure 4C:
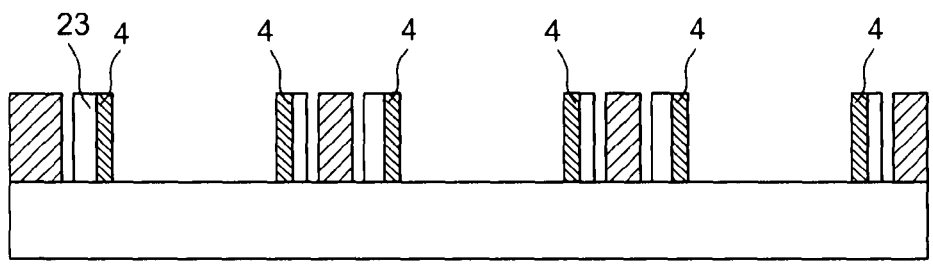
Figure 4D:
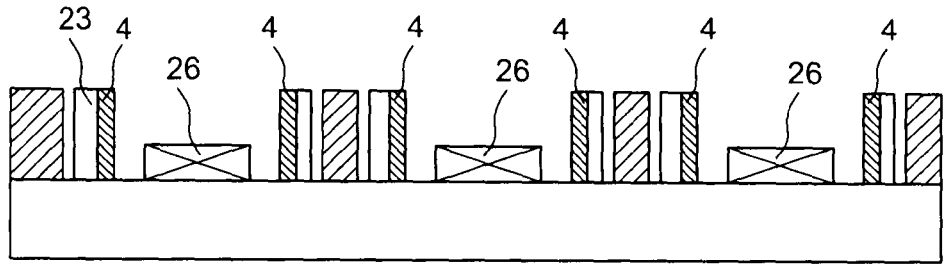
Figure 4E:
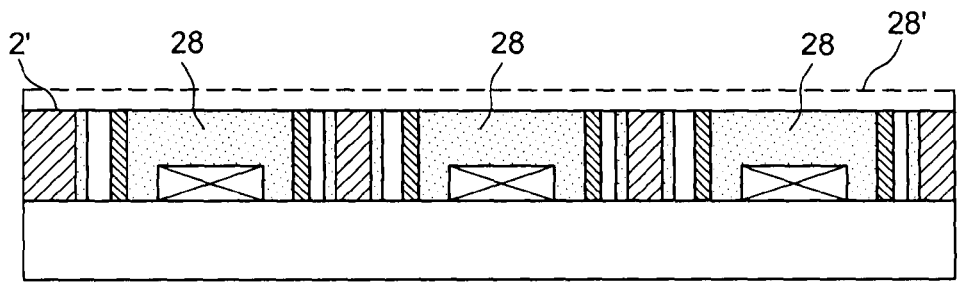

If the encapsulation extends beyond the summit of the vias 4, as illustrated in FIG. 4E where the reference 28' represents an excessive level of encapsulation, a thinning or a surfacing of the assembly makes it possible to reach the surface 2', which makes conducting zones 72, 74 appear corresponding to the upper end of the vias 4. A connection surface 2', in which the conducting zones formed by the conducting ends 72, 74 of vias 4 are flush, is thereby formed. This connection surface will make it possible, subsequently, to accommodate for example an additional stage of components for the purpose of forming a stacking of stages.

Finally, the disbondment of the support 27 and a passivation of the surface thereby left free are carried out. It is in particular possible to form a layer of photosensitive dielectric material 31 (FIG. 3B), and etch in this layer openings 32, from which it will be possible to establish connections between the components 26 and the vias 4, and if necessary from one component 26 to another situated in the same plane. For example, these external connections, or this rear rerouting, are formed by a step of metallisation on the face 33 of the layer 31 opposite to the face of this layer on which the components 26 rest. The vias 4 may serve as alignment pattern for photolithography steps on the rear face.

As already explained above, each individual substrate and its component, the latter corresponding to the electronic and/or mechanical part of the chip, with its tracks and its connection means, form a non encapsulated chip that is transferred onto the reference surface before encapsulation. The tracks and the connection means are integrated into the chip and only the ends or terminals of these connection means are flush.

A front face 2' rerouting may also be carried out, as already explained above. It is for example a copper metallisation. A passivation may be carried out above the rerouting metal.

Figure 5:
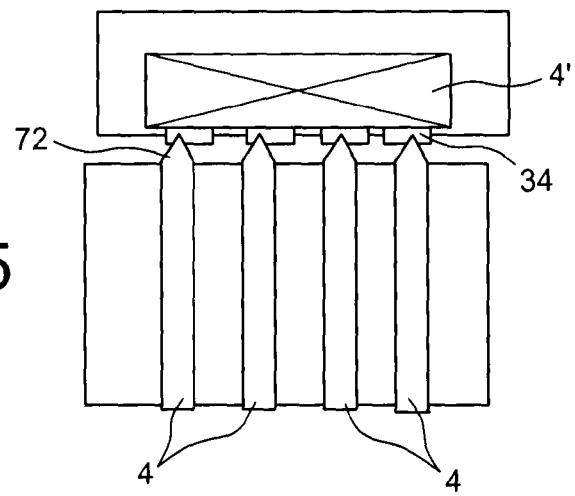
FIG. 5 represents vias with conical or point-shaped end.

In order to assure a better contact with an external component or a component 4' placed on the surface 2' of the reconstituted substrate (like the component 4' of FIG. 1D), the end 72 of the vias 4 may have a trunconic or pointed shape (FIG. 5). These points can come into contact with pads 34 of the component 4'. They can also come into contact with one or more components or one or more vias of an upper stage positioned above the stage 2. This makes it possible to form simultaneously the vias and interconnection means with another upper stage.

FIGS. 6A-6G are steps of an example of manufacturing vias on chips.

Figure 6A:
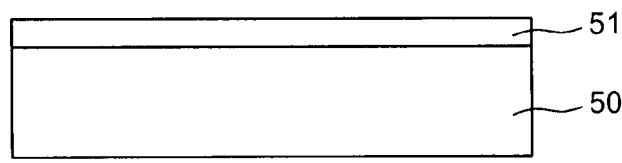
FIGS. 6A-6G are steps of an example of manufacturing vias on chips.
Figure 6B:
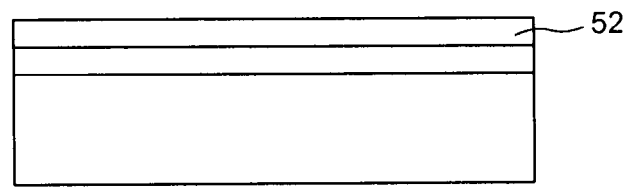
Figure 6C:
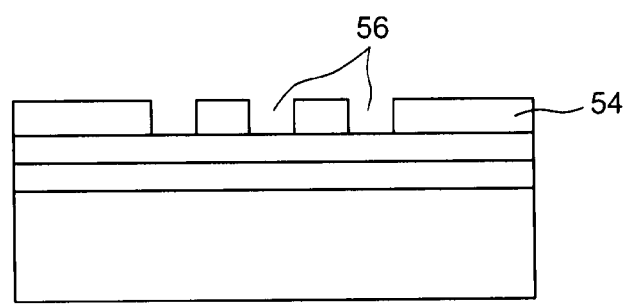

As illustrated in FIG. 6A, a deposition of an insulating layer 51, for example made of $SiO_2$, is firstly carried out on the substrate 50.

The deposition (FIG. 6B) of a conducting layer 52, for example a Ti/Cu alloy, is then carried out.

By photolithography, zones for electrolysis of a metal, for example copper, are delimited. The reference 54 designates a resin mask comprising the openings 56 enabling these zones to be delimited.

Figure 6D:
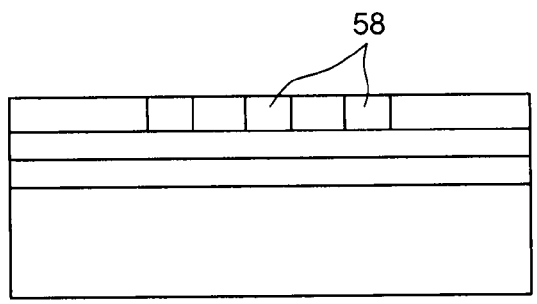
Figure 6E:
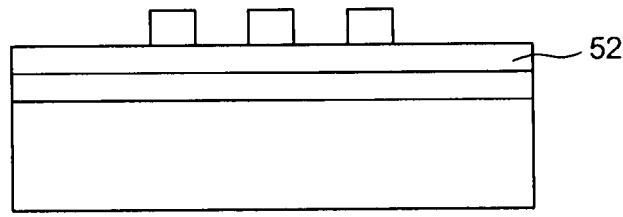
Figure 6F:
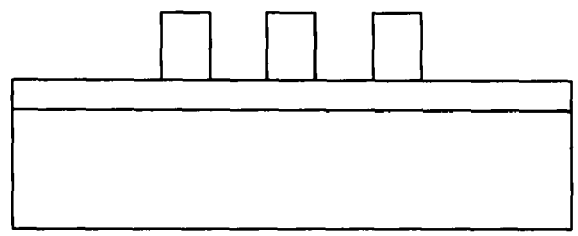

The growth of metal, by electrolysis, may then be carried out in the openings 56 (FIG. 6D). The resin 54 is then removed (FIG. 6E), leaving remaining strips 58 on the continuous base 52. This is then etched (FIG. 6F). Practically, at this stage, the structure of FIG. 3A is obtained, without the substrate 5'. Then the chips are cut to the requisite sizes.

Figure 6G:
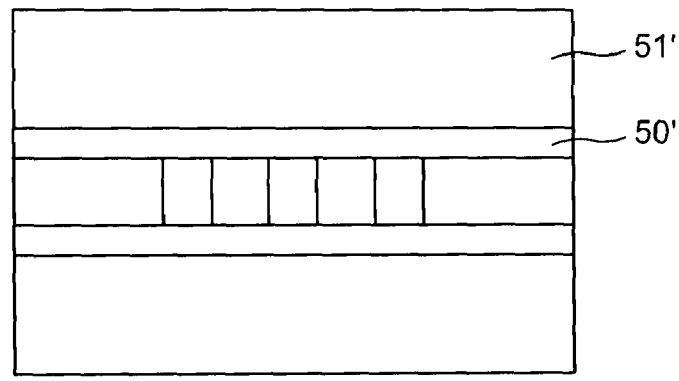

If necessary, as illustrated in FIG. 6G, the assembly thereby obtained may be assembled with a substrate 50', for example by means of a dielectric layer 51', to enable the handling and the rotation of the chip.

The method described above enables a reconstituted substrate to be formed in which the vertically placed components are conductive vias. It will be understood that this type of method may be applied to any other type of component or more complex stacking of components, for example MEMS, with or without vias in the substrate. For each individual chip to be positioned vertically, a prerouting 69 (FIGS. 1A-1C) formed on the surface of the substrate 5, 7 makes it possible to connect the electrical connection means 72, 74 which project from the substrate 5, 7 or which are situated near to one side, or opposite sides 3', 3" of the substrate on which the chip 3, 7 is formed. These connections 72, 74 then make it possible to reconnect the different components of the reconstituted substrate, through formation of a rerouting on the surface or surfaces 2' or 2", as already explained above.

Figure 7A:
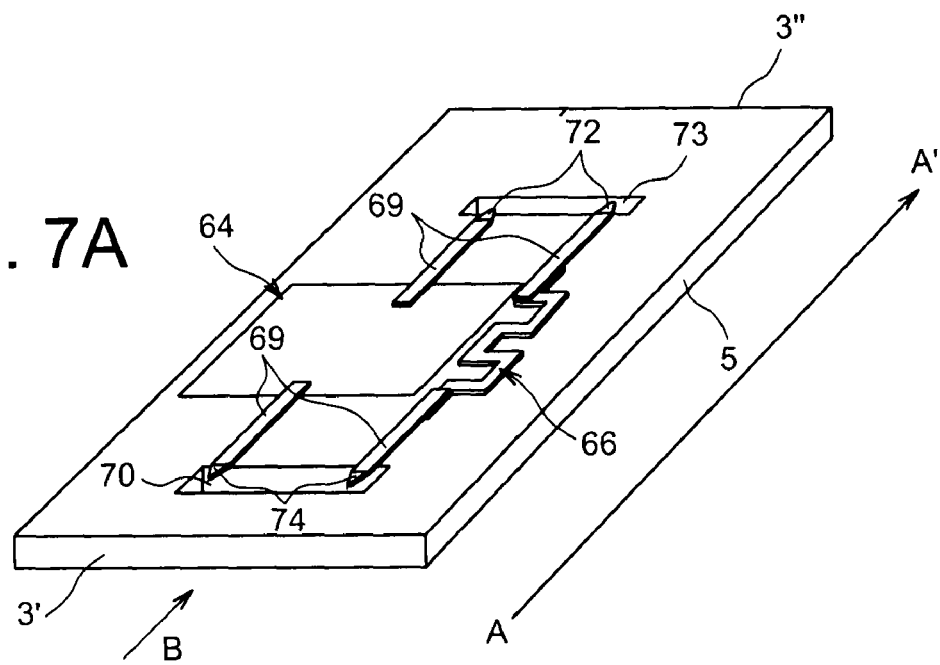

FIGS. 7A and 7B show examples of passive components, 64, 66, 68 formed on a substrate 5, for example made of silicon.

These passive components may form, on a same substrate 5, a functional assembly, such as for example the passive components 64, 66 of FIG. 7A (here: a capacitance and a resistance), or constitute a series of identical elements such as the passive components 68 of FIG. 7B (here: two inductances).

The surface of the substrate 5 that carries each component or each assembly of components is provided with a prerouting 69 that is connected, as explained above with reference to FIG. 1A, to one or more lateral outputs of the contacts 72, 74 of the chip.

Preferentially, whatever the component (or components) formed on the surface, one or more recesses 70, 73 are formed in the extension of the prerouting 69 and into which the connection elements 72, 74 emerge. Each recess has substantially the shape of a slot parallel to one of the sides 3', 3" and may be filled with an insulating material. This material will enable an insulation at each surface 2', 2" of the substrate, since these surfaces will in fact be formed, after reconstitution, in part by the edges 3, 3' of the substrates on which the components are formed and in part by the encapsulant 28 (as in FIG. 3B).

A component may only have a prerouting and connection means on a single side, for example as illustrated in FIG. 7C where the tracks 69 connect a component 65 to connection elements 72 situated uniquely on one of the sides 3' of the substrate 5.

Before reconstitution of a substrate 2, such elementary components may be assembled or stacked, according to different methods, as explained below with reference to FIGS. 8A-8C and 9A-9C.

Thus, in FIG. 8A are represented three stacked components. The components are seen along the direction indicated in FIG. 7A by the arrow B. The side 3' of the substrate 5 of this FIG. 7A is moreover also identified in FIG. 8A.

This assembly may then be rectified (grinding step), along a direction parallel to the direction AA' identified in FIGS. 7A and 7B, in other words from one and/or the other of the sides 3', 3", until the material 71 for filling the cavity 70 is revealed. If this rectification step is continued, the ends of the connection elements 74 appear, as illustrated in FIG. 8C. This step of rectification of the assembly of substrates thus makes is possible to reveal the zones filled by the insulating material, then the ends of the prerouting.

The case of FIGS. 9A-9C is that of a stacking of substrates, such as those of FIGS. 7A-7C, but for which one of the cavities 70 has a width identical to the width l (see FIG. 7A) of the substrate 5. The rectification operation thus makes the filling material 71 of this cavity appear, but over the width substantially equal to that, l, of the substrate 5. If the rectification is continued, in the same direction, the ends of the connection elements 74 appear (FIG. 9C).

The same rectification operations may be carried out from the end 3" of the substrate 5.

Consequently, depending on the size of the cavities 70, 73 and the cutting dimensions, it is possible to completely, or almost completely, remove the material from the substrate 5 on the surface of the substrate reconstituted by stacking. It is moreover preferable not to leave the semi-conductor material bare.

FIG. 10 represents, in side view, an assembly 40 of stacked components 4, after the operation of rectification: at one of the ends of this stacking appear both the filling material 71, which entirely covers the sides of the individual substrates, and the ends of the connection elements 74. An assembly of components is obtained, which may be directly incorporated vertically into a reconstituted substrate according to the invention.

In the examples given above, the recesses 70, 73 are filled with the filling material 71 before assembly of the chips. As an alternative, the chips may also be cut, then stacked and assembled with a material that will serve for the bonding and filling.

The incorporation of individual components, such as those of FIGS. 7A-7C, or stackings 40 of such components, such as those of FIG. 8C, 9C or 10, in a reconstituted substrate may be achieved by means of a method similar to that described above with reference to FIGS. 4A-4C (positioning of a frame on a substrate, positioning of components perpendicular to the substrate, encapsulation). The ends of the connection elements 72, 74 are flush with the surface 2' and/or 2" of the reconstituted substrate 2, or appear at this or these surface(s).

Figure 11:
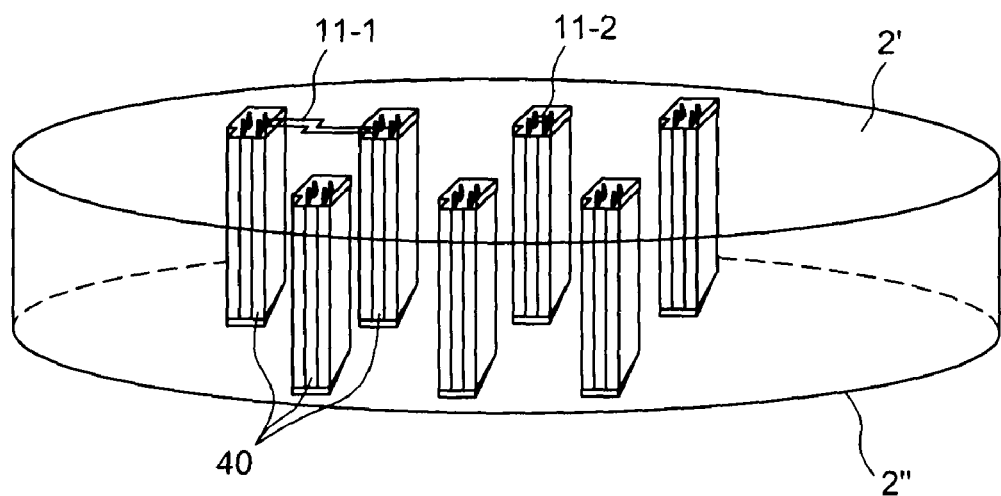
FIG. 11 represents a reconstituted substrate according to the invention.

FIG. 11 represents such a reconstituted substrate 2 comprising several assemblies, such as the assemblies 40 of FIG. 10, incorporated vertically. The substrate may if necessary be ground on one and/or the other of its faces 2', 2", to free the preroutings.

Then, using standard microelectronic methods such as those already indicated above, one or more connections are formed between the various components or inside the component itself: thus, in FIG. 11 are represented connections 11-1 between two series or groups of components and connections 11-2 inside a same group of stacked components.

Depending on the case, there may be a prerouting on one and/or the other of the two faces 2', 2".

Figure 12A:
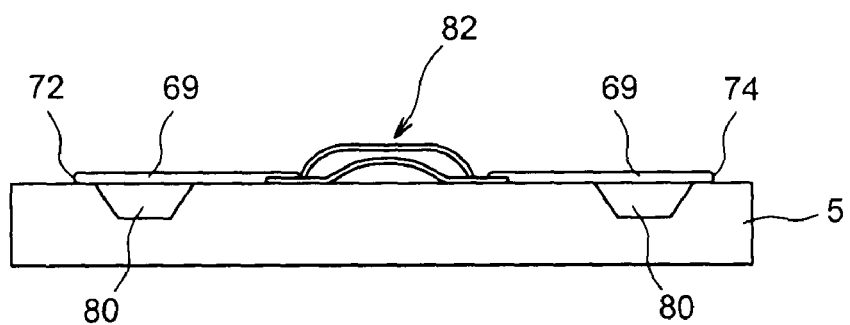
FIGS. 12A-12B represent the preparation of a component for the purpose of its integration into a reconstituted substrate, by a method according to the invention.
Figure 12B:
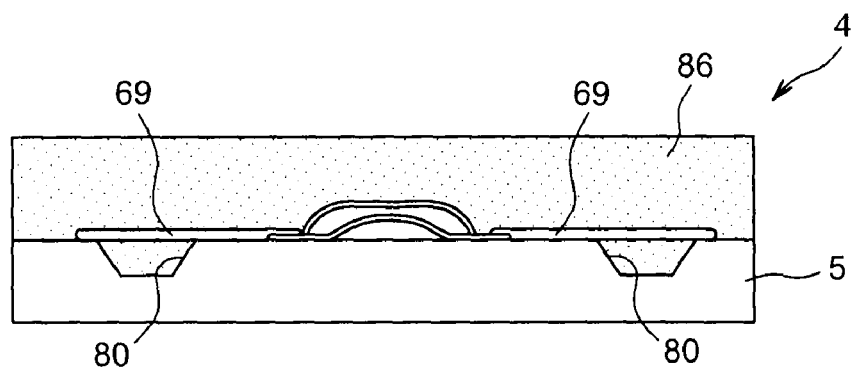

FIGS. 12A and 12B represent another example of preparing a component 4 for the purpose of its integration in a device according to the invention. In this example, the component itself is a MEMS 82 covered by a lid or a protection 84; this structure may be applied to other components.

From the component 82, prerouting or connection tracks 69 are formed, then cavities 80 are etched in the substrate 5, under these tracks 69.

An insulating material 86 is then deposited (FIG. 12B) on the surface of the substrate 5 and in the cavities 80. The cavities 80 and this material 86 play, in this example, a similar role to the recesses 70,73 and to the filling material 71 of FIGS. 7A and 7B. The insulating material may extend beyond the ends 72, 74, which may then require a thinning operation, as explained below.

Figure 13A:
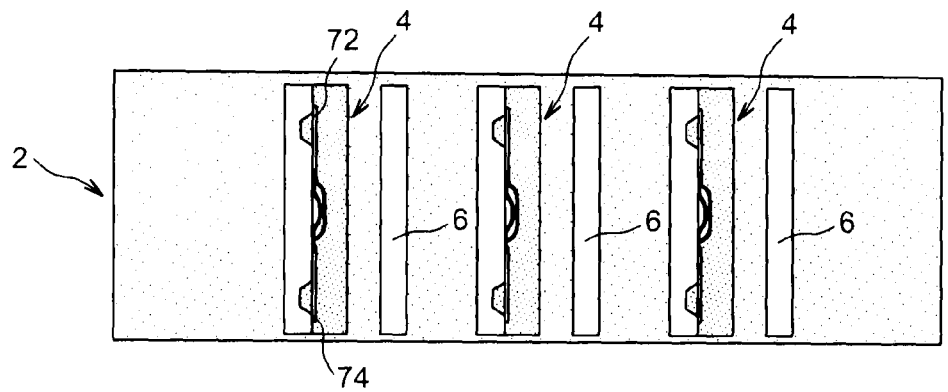
FIGS. 13A-13B represent the integration of components of the type of those of FIGS. 12A and 12B.
Figure 13B:
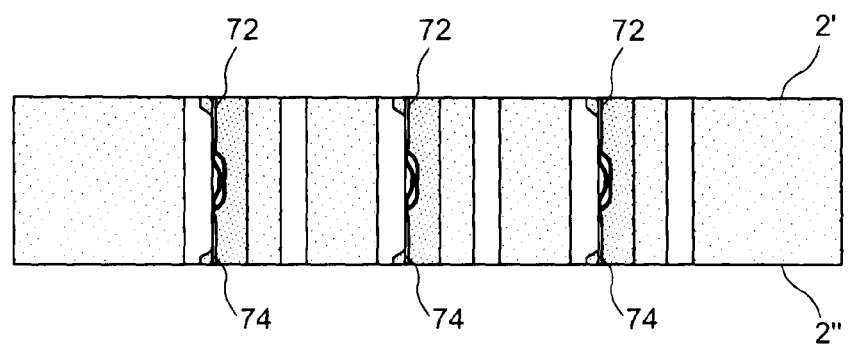

FIGS. 13A and 13B show an example of incorporation of MEMS type components, for example of the type described above with reference to FIGS. 12A and 12B, for the purpose of forming a reconstituted substrate 2. Said reconstituted substrate may be obtained by a method similar to that described above with reference to FIGS. 4A-4E. Other components 6 may be incorporated in the same reconstituted substrate, by the same method steps.

It may be seen in FIG. 13A that the ends 72, 74 of the connection elements of the components 4 are not accessible from the exterior. An additional step of thinning of the reconstituted substrate is thus carried out, so that said ends are accessible at the level of the surfaces 2', 2" (FIG. 13B).

Preferentially, it is possible to remove, by a thinning method (grinding, etching, etc.), before the integration of components in the substrate, the material of the components (for example: silicon) that would be apparent. To avoid having silicon apparent, it is thus possible to thin the chips and remove the silicon under the cavities. Then, the chips are assembled in the reconstituted substrate.

Another implementation example of a method according to the invention is illustrated in FIGS. 14A-14I.

Firstly (FIG. 14A), various electronic components 3, 9 are formed collectively on the face, known as front face, of a substrate 50. For example, one or more passive components and/or one or more MEMS type components are thus formed.

Then (FIG. 14B), by photolithography by means of a mask 154, recesses 156 are delimited which will make it possible to carry out an etching of the substrate by its rear face 500.

Figure 14A:
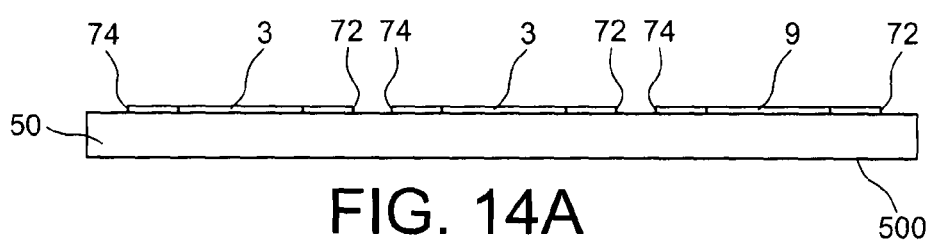
FIGS. 14A-14I represent implementation steps of a method according to the invention.
Figure 14B:
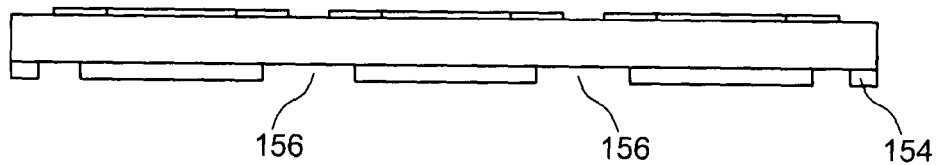
Figure 14C:
Figure 14D:
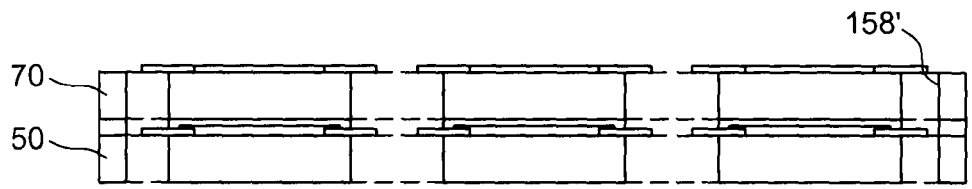
Figure 14E:
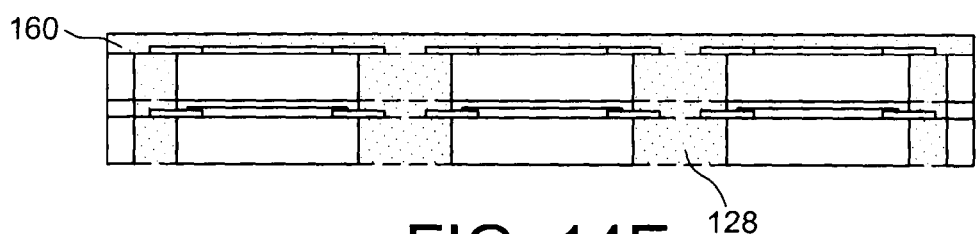

An anisotropic etching of the substrate 50 is then carried out through these recesses 156 (FIG. 14C). Cavities 158 are thereby formed in this same substrate, under the connection ends 72, 74 and if necessary partially under the tracks 69.

During a subsequent step (FIG. 14D), the first stage thereby formed may be assembled, for example by bonding, with a second stage, it also comprising a plurality of components, identical or different to those of the first stage, formed on the surface of a substrate 70. This second stage may be formed in a manner similar to the first.

The recesses 158, 158' may be filled with an encapsulant 128 (for example an epoxy resin). A reinforcement of the structure may be obtained by added thickness 160 of this encapsulant.

Figure 14F:
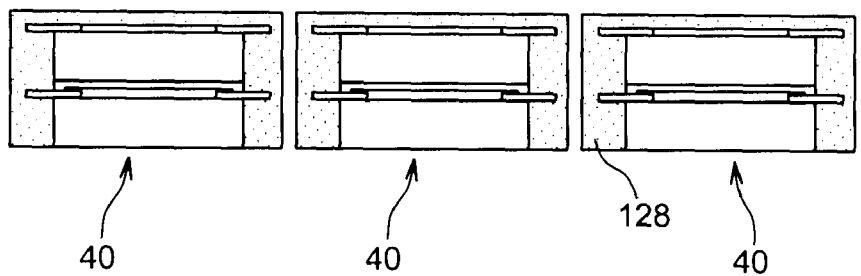

The structures thereby formed may then be cut (FIG. 14F). Stackings 40 are thus obtained, each comprising two individual superimposed components.

These different stackings 40 may be positioned and fixed on a substrate or a wafer, or on an adhesive element 127, for example by means of a frame 129 having openings 190, 192, 194 (FIG. 14G), the width or the diameter of which enables an introduction of these stackings, in a "vertical" or perpendicular manner to the plane defined by the wafer 127. In fact, it is the flat surface of this wafer or substrate 127 that is going to determine the plane of the substrate that is going to be reconstituted.

Figure 14G:
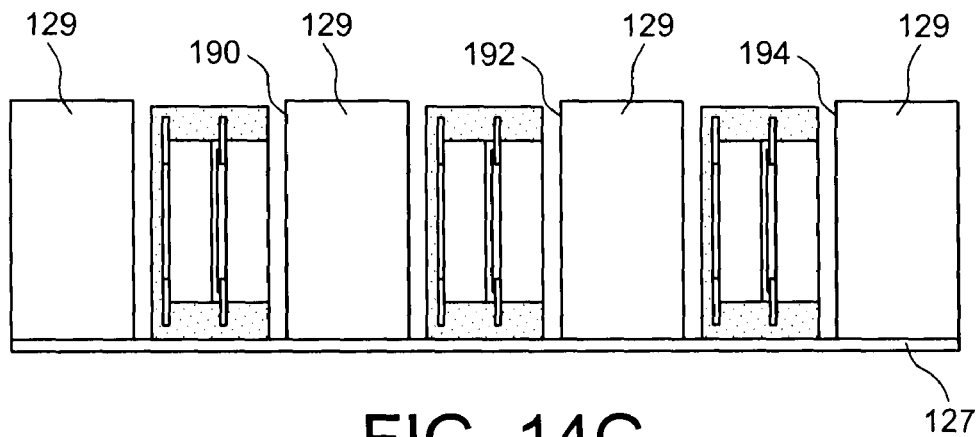
Figure 14H:
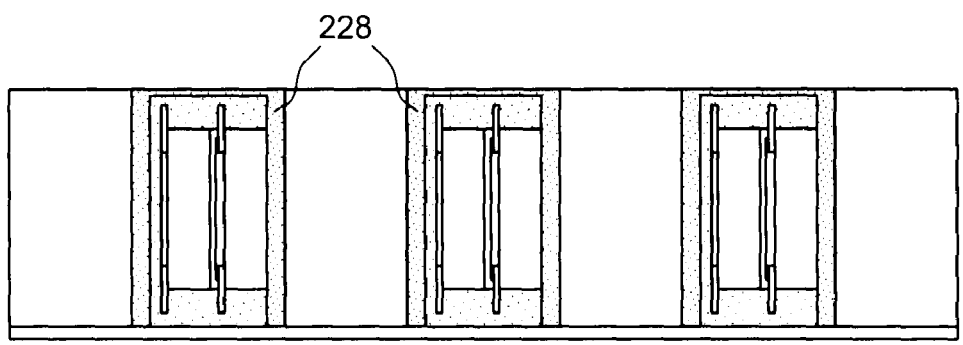

These openings may then be filled, for example by means of an encapsulant 228 such as a resin (FIG. 14H).

Finally, a step of thinning (grinding) is carried out to free the connections (FIG. 14I) and ensure that their ends 72, 74, or connection pads, are accessible from one and/or the other of the faces 2', 2" of the substrate thereby reconstituted 2. A surface rerouting 11, 11' may then be carried out from these pads.

Another implementation example of a method according to the invention is illustrated in FIGS. 15A-15F.

Firstly (FIG. 15A), various electronic functions are collectively formed on one face, known as front face, of a substrate 50. For example, one or more passive and/or MEMS components 3, 9 are thus formed. References 72, 74, once again designate connection elements to these various components.

Then (FIG. 15B), by photolithography by means of a mask 154, recesses 156 are delimited that will make it possible to carry out an etching of the substrate by its front face, between neighbouring components.

An anisotropic etching of the substrate 50 through these recesses 156 (FIG. 15C) is then carried out. Cavities 158 are thus formed in this same substrate, above which the connection pads 72, 74, and if necessary a part of the tracks 69, are free.

Figure 15A:
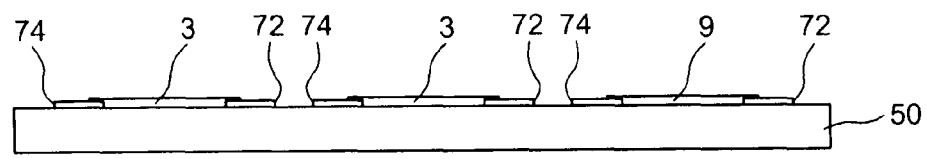
FIGS. 15A-15F represent implementation steps of another method according to the invention.
Figure 15B:
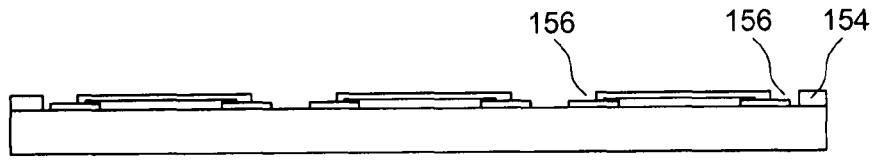
Figure 15C:
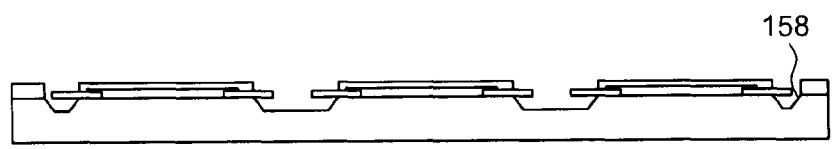
Figure 15D:
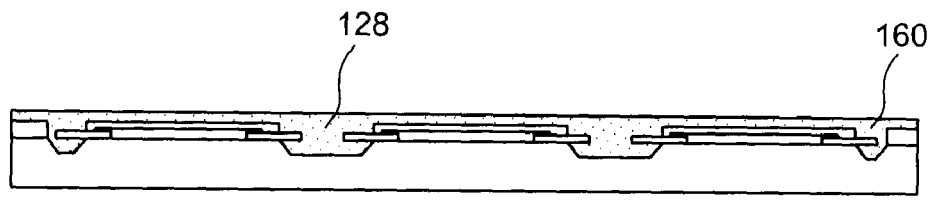
Figure 15E:
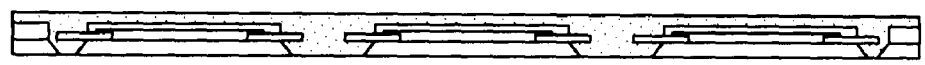

The cavities may then be filled by means of an encapsulant 128 such as a resin (FIG. 15D). A reinforcement of the structure may be obtained by added thickness 160 of this encapsulant.

A thinning of the substrate 50 (FIG. 15E) is then carried out, and if necessary a bonding with a second stage, as already explained in the above embodiment.

Figure 14I:
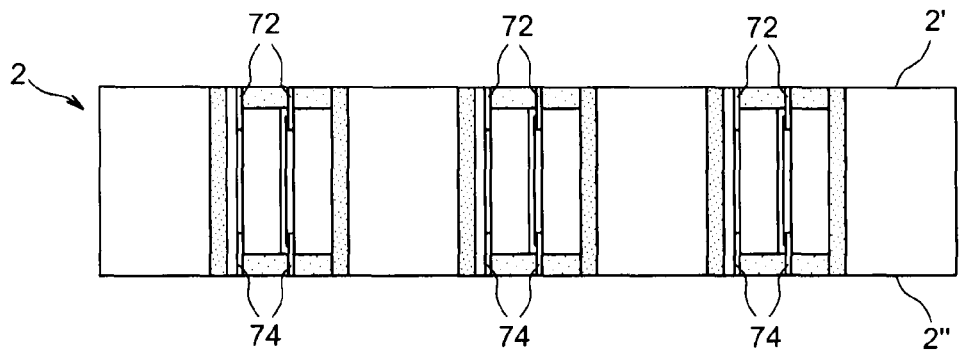
Figure 15F:
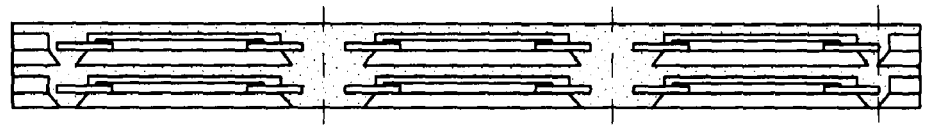

Then, the steps described in the first example are repeated, in particular the steps described with reference to FIGS. 14G-14I, the assembled components may be cut along the broken lines of FIG. 15F.

In the various examples given above, the two exterior faces 2', 2" of the reconstituted component 2 are accessible, and make it possible in particular to form a horizontal rerouting from the connection elements of components that appear at these surfaces.

Figure 16:
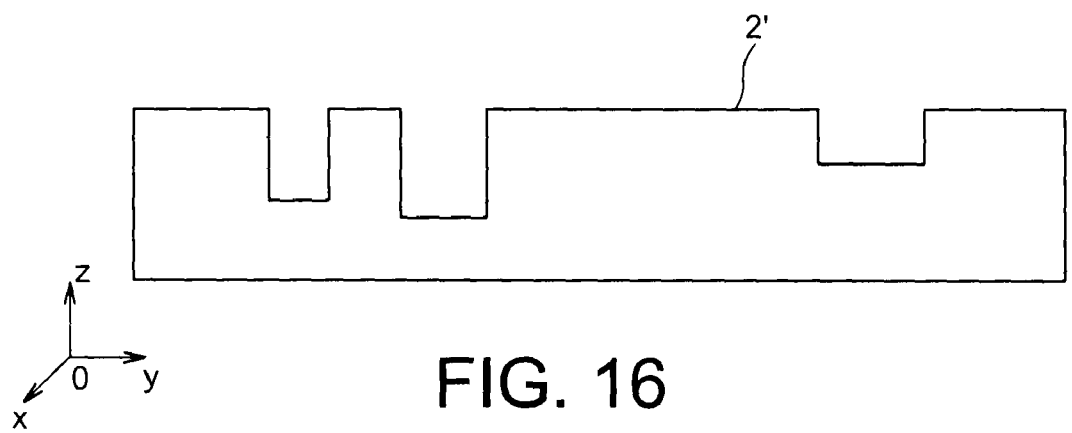
FIG. 16 represents a substrate from which a device according to the invention may be formed.

But it is also possible to place the components in a substrate having a shape such as indicated in FIG. 16. In this substrate are formed, for example by etching, cavities, which may have different depths to each other. These cavities make it possible to accommodate components in a direction perpendicular to a plane xOy defined by the substrate. These cavities are not transversal, which signifies that only one of the faces 2' of the substrate may be used for a surface rerouting. Components in the various cavities may be supported by means of, once again, an encapsulant.

The invention may be used for the formation of high speed memory modules, because it makes it possible to reduce the lengths of tracks and to stack chips.

Micro-batteries, and/or MEMS, with or without openings towards the exterior, and/or a network of sensors may also be integrated. The invention may also be used to form communicating and mobile systems. Communication antenna may thus be formed on the surface 2' or 2".

In all of the configurations presented, the invention makes it possible to incorporate a multitude of different or identical functions and to create blocks (for example memory blocks) or complete systems, by forming the interconnection between these blocks or systems.

The interconnection is formed between the chips or between systems by standard microelectronic methods, on one face or on the two faces 2', 2" of the reconstituted substrate 2. The use of two faces also makes it possible to form an additional stacking, for example to stack two reconstituted substrates.

It has been indicated that a method according to the invention may comprise if necessary a step of thinning. This step makes it possible in particular to remove the added thickness 28' of encapsulant or instead to go from FIG. 13A to FIG. 13B or from FIG. 14H to FIG. 14I. In order to facilitate this, the chips or components 4, 6, 40 may contain patterns for controlling the depth of the thinning. For example, the appearance of patterns at certain altitudes in the substrate is observed. Pattern profiles may be formed that enable, thanks to a dimensional measurement, the depth of the thinning to be known.

Generally speaking, the invention makes it possible to integrate, in a same substrate, components of different sizes. Chips of different sizes are placed in the reconstituted substrate, then an encapsulation is carried out to encapsulate all the chips. When the substrate is formed the face that comprises the connections is treated. In the case of U.S. Pat. No. 5,688,721, components of different sizes can only be used by assembling false chips to form a stable structure.

The invention claimed is:

1. A method of producing a reconstituted electronic device including, between a first face and a second face, a plurality of individual dies perpendicular to the first face and the second face, each individual die being bare, without packaging, tracks and connections being integrated in each individual die, only ends of the connections being flush, each individual die including a first side and a second side opposite to the first side, and including at least one component, the connections of each individual die being directed from the at least one component to the first side or the second side, the method comprising:

a) positioning one of the first and second sides of each individual die on a reference surface, so that each individual die is placed perpendicular to the reference surface;

b) encapsulating the plurality of individual dies with an encapsulant, so that the connections of each individual die are flush with at least one or other of faces of a reconstituted substrate.

2. The method according to claim 1, wherein the at least one component of an individual die includes tracks and connections directed from the at least one component to the first side and to the second side of said individual die, and flush with, after encapsulation and if necessary thinning, the at least one face of the reconstituted substrate.

3. The method according to claim 1, wherein the positioning includes positioning at least two individual dies perpendicular to the reference surface with a non zero angle between the at least two individual dies.

4. The method according to claim 1, wherein at least one individual die includes a metal track that forms the component and a connection track.

5. The method according to claim 4, further comprising, before the encapsulating b), positioning the at least one individual die that includes the metal track, and after the encapsulating b), establishing an electrical connection between another component and the metal track.

6. The method according to claim 1, further comprising, before the positioning a), stacking at least two individual dies, the two individual dies then being positioned together, perpendicular to the reference surface.

7. The method according to claim 1, wherein at least one individual die includes, on one of its sides, another encapsulant.

8. The method according to claim 1, wherein at least one individual die includes a MEMS component.

9. The method according to claim 1, further comprising positioning at least one component on at least one of the first or the second face of the reconstituted electronic device, or flush with one of the first or the second face of the reconstituted electronic device.

10. The method according to claim 1, further comprising positioning frame delimiting zones, in which one or more individual dies are positioned.

11. The method according to claim 1, wherein the reference surface is a surface of a substrate.

12. The method according to claim 1, wherein the reference surface is an adhesive surface.

13. The method according to claim 1, further comprising forming connection tracks on at least one of the first face and the second face of the reconstituted electronic device.

14. The method according to claim 1, wherein the encapsulating b) includes thinning the encapsulant so that the connections of each individual die are flush with at least one face of the reconstituted substrate.

15. The method according to claim 1, wherein the at least one component includes at least one of an electronic part and a mechanical part.

16. A reconstituted electronic device comprising:
a first face and a second face,
a plurality individual dies, that are bare and without individual encapsulation, said individual dies being perpendicular to the first face and the second face, each individual die comprising an individual substrate, at least one component, and connection tracks that are flush with one or other of faces of a reconstituted substrate; and
an encapsulant that encapsulates the plurality of individual dies, wherein at least top or bottom surfaces of the plurality of dies are not covered with the encapsulant.

17. The device according to claim 16, further comprising rerouting means for connecting the connection tracks to another component.

18. The device according to claim 17, wherein at least one individual die includes a metal track forming the component and the rerouting means.

19. The device according to claim 18, further comprising another component and electrical connections between the another component and the metal track.

20. The device according to claim 16, wherein at least two individual dies are perpendicular to the first and second faces, with a non zero angle between the at least two individual dies.

21. The device according to claim 16, wherein at least two individual dies are stacked and positioned together, perpendicular to the first and second faces.

22. The device according to claim 16, wherein at least one individual die includes a MEMS component.

23. The device according to claim 16, further comprising at least one other component on at least one of the first and second faces of the reconstituted electronic device, or flush with one of the first and second faces.

24. The device according to claim 16, further comprising at least one connection on at least one of the first face and the second face.

25. A reconstituted electronic device comprising:
a first face and a second face,
a plurality of bare, non encapsulated individual dies that are perpendicular to the first face and the second face, each individual die comprising at least one component, and tracks and connections that are flush with one or other of faces of a reconstituted substrate; and
an encapsulant that encapsulates the plurality of individual dies, wherein
the at least one component comprises rerouting circuits and connections that are flush with the first face and/or the second face of the reconstituted substrate.

26. A reconstituted electronic device comprising:
a first face and a second face,
a plurality of bare, non encapsulated individual dies that are perpendicular to the first face and the second face, each individual die comprising at least one component, and tracks and connections that are flush with one or other of faces of a reconstituted substrate;
an encapsulant that encapsulates the plurality of individual dies; and
at least one other component on at least one of the first and second faces of the reconstituted electronic device, or flush with one of the first and second faces.

* * * * *